United States Patent [19]
Abbott et al.

[11] 3,947,764
[45] Mar. 30, 1976

[54] METHOD AND APPARATUS FOR TESTING DC MOTORS

[75] Inventors: Edward H. Abbott, Ann Arbor; Robert L. Johnstone, Plymouth, both of Mich.

[73] Assignee: Ford Motor Company, Dearborn, Mich.

[22] Filed: Aug. 5, 1974

[21] Appl. No.: 489,276

[52] U.S. Cl. .............................. 324/158 MG; 322/99
[51] Int. Cl.² .................. G01R 31/00; H02K 11/00
[58] Field of Search ............... 324/158 MG, 55, 64; 318/490; 322/99

[56] References Cited
UNITED STATES PATENTS

| | | | |
|---|---|---|---|
| 3,052,117 | 9/1962 | Miller et al. | 324/158 MG |
| 3,195,044 | 7/1965 | Flanagan | 324/158 MG |

*Primary Examiner*—R. V. Rolinec
*Assistant Examiner*—Ernest F. Karlsen
*Attorney, Agent, or Firm*—Robert W. Brown; Keith L. Zerschling

[57] ABSTRACT

Method and apparatus for testing DC motors, particularly permanent magnet DC motors, involving application of a constant voltage across the motor terminals and at an earlier or later time causing a constant current to flow through the motor. The constant voltage is applied across the motor terminals for a first predetermined time interval during a portion of which the current flow through the motor is compared with a reference level. If the motor current falls below the reference level during the portion of the first predetermined time interval the motor is defective. The constant current is caused to flow through the DC motor for a second predetermined time interval. If at the end of this second predetermined time interval, the DC motor terminal voltage is below a first level or above a second level, that is, the terminal voltage is outside an established voltage range, then the motor is found to be defective.

10 Claims, 7 Drawing Figures

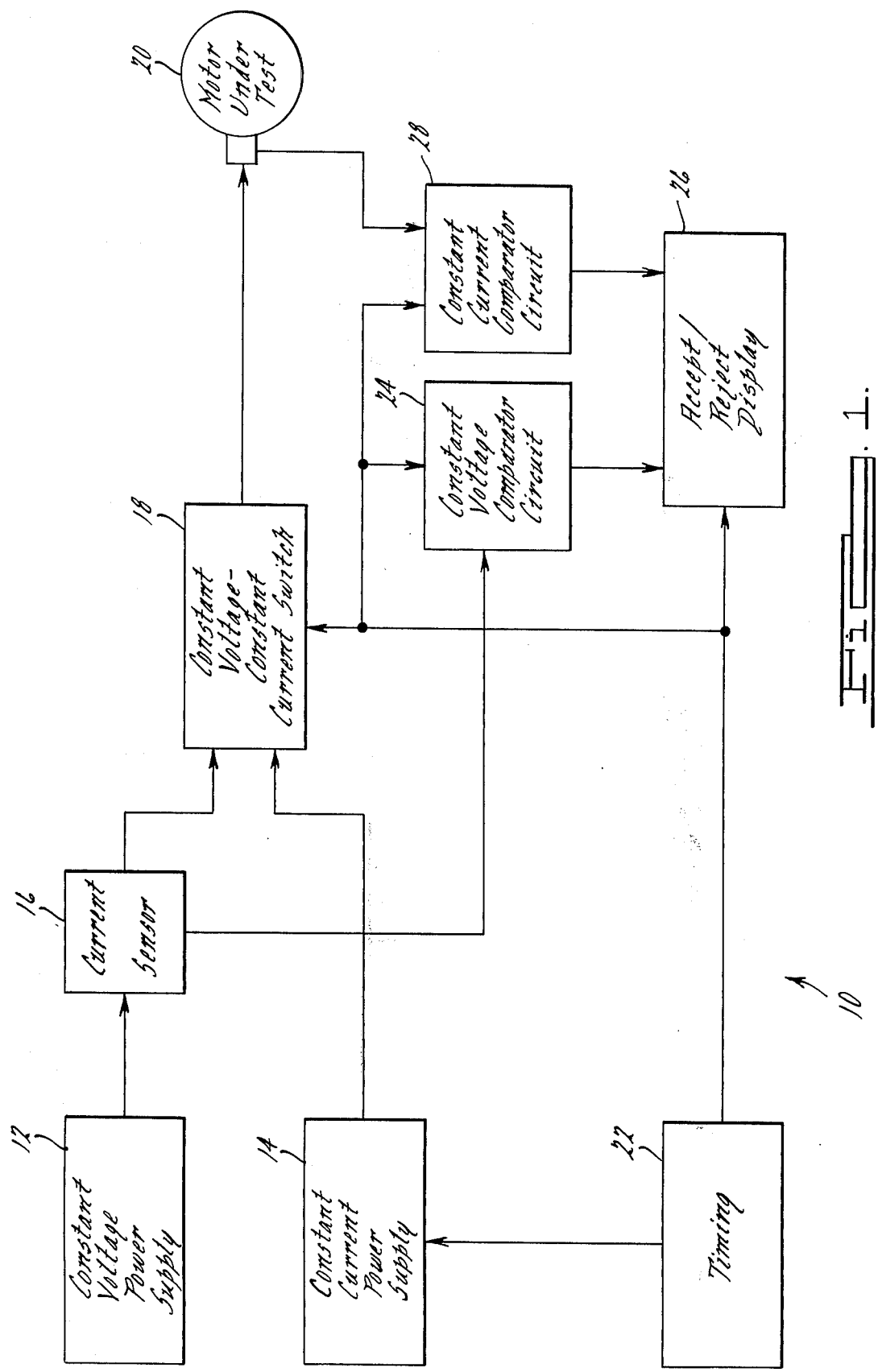

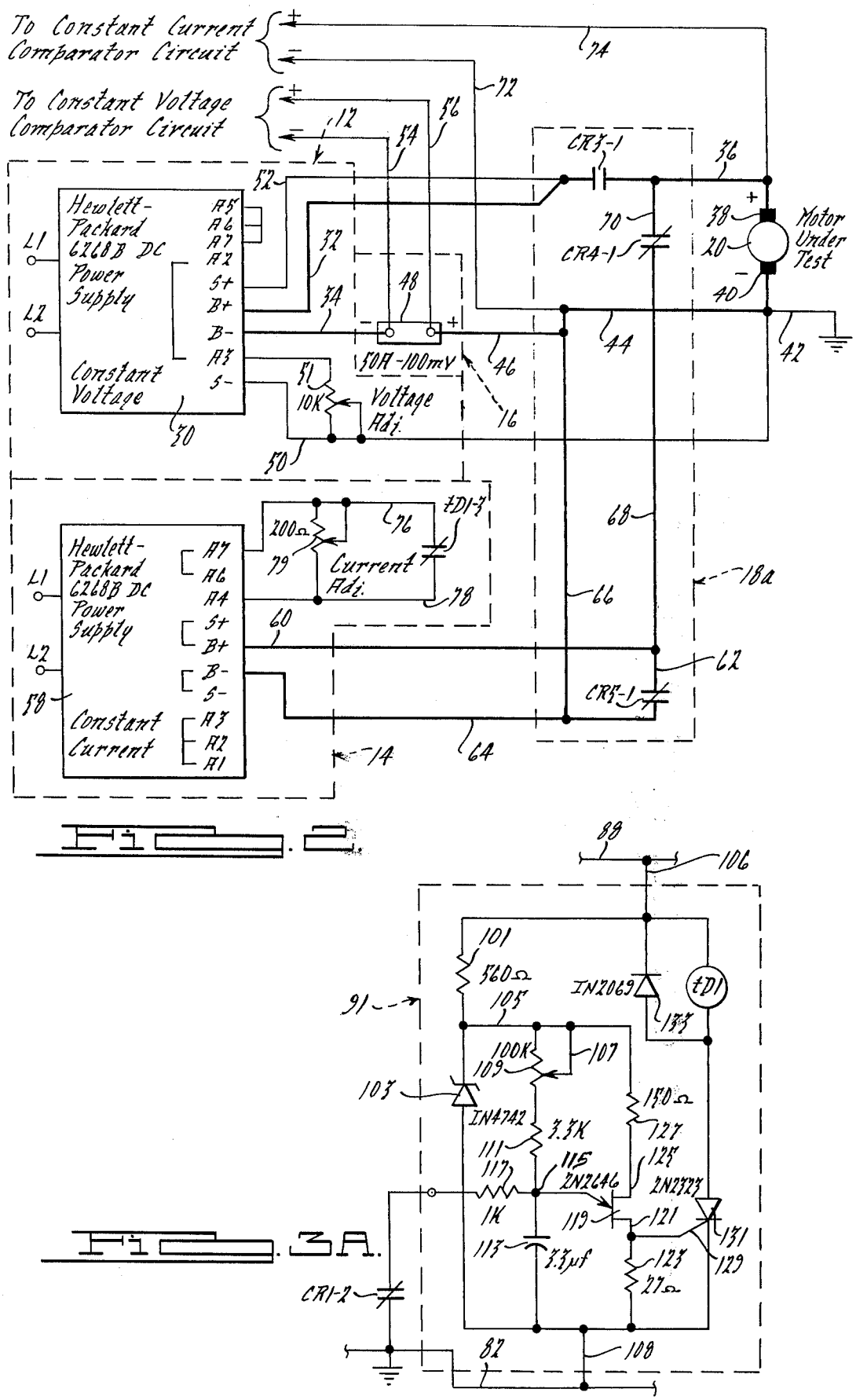

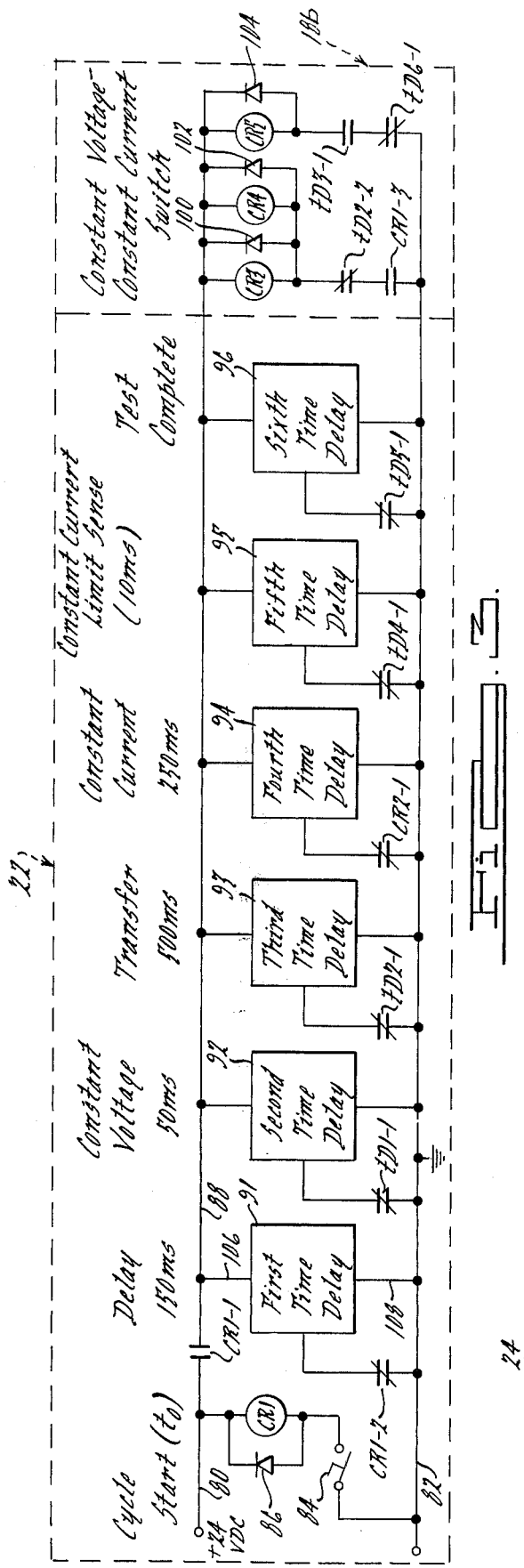

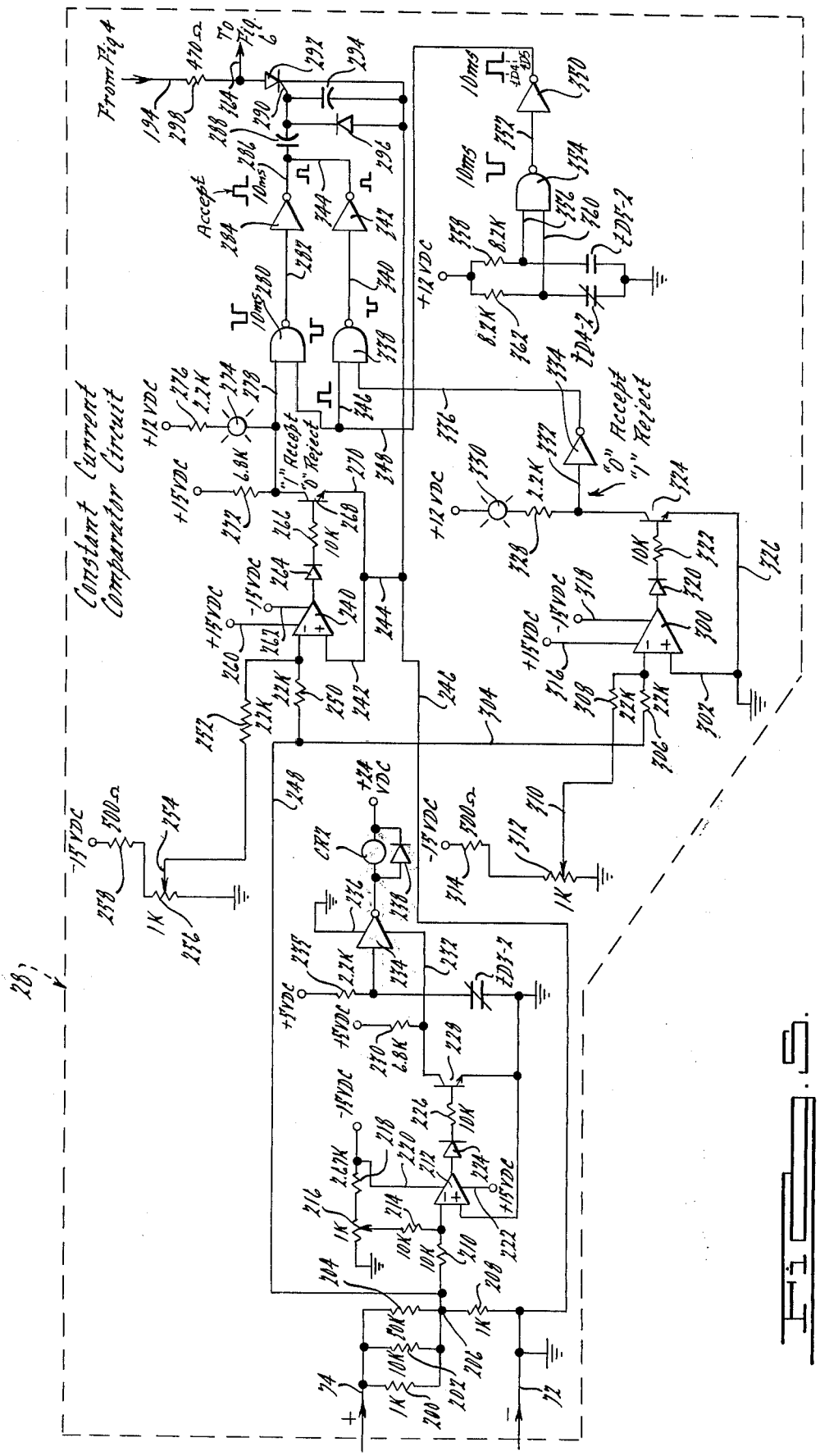

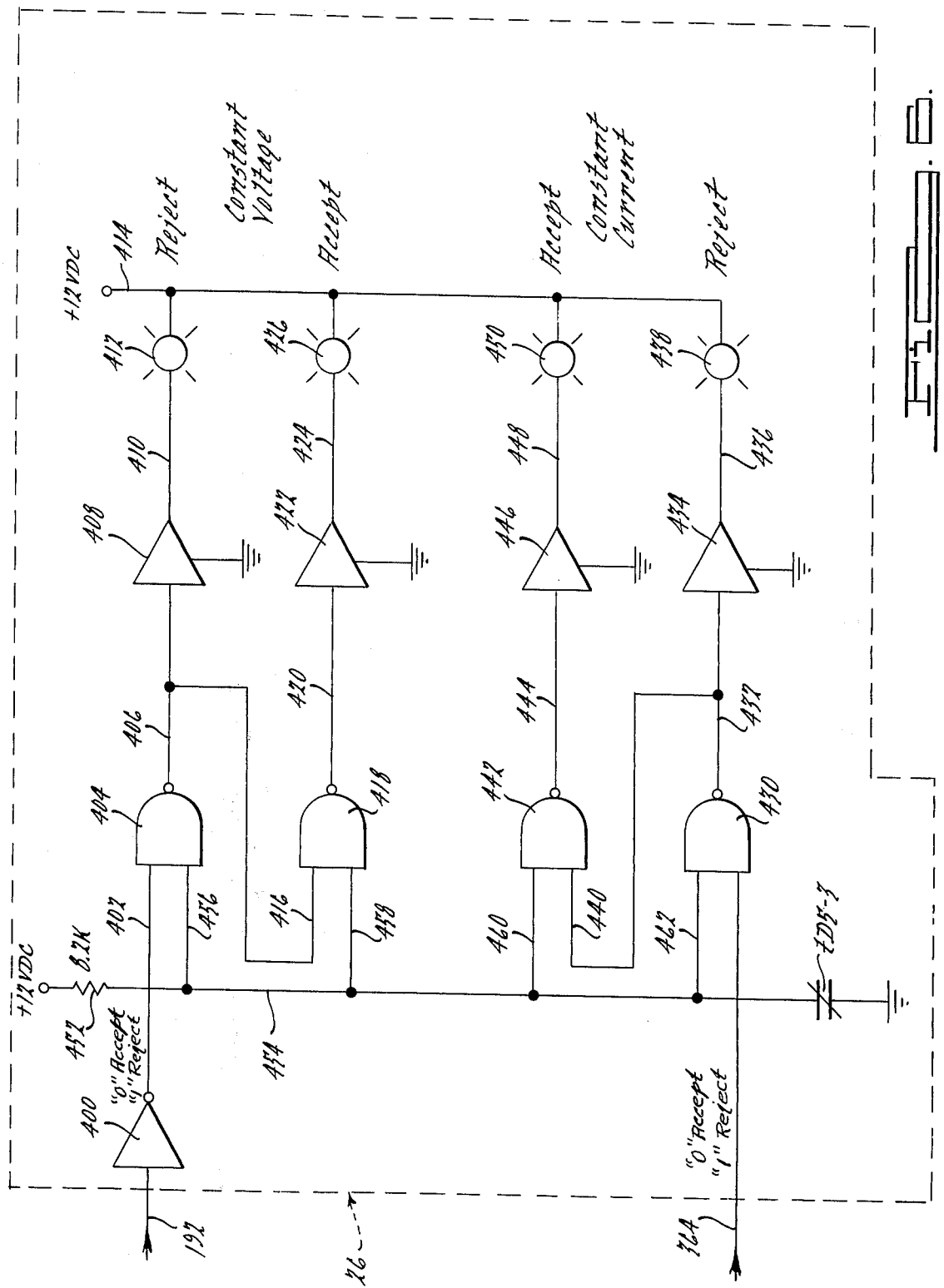

METHOD AND APPARATUS FOR TESTING DC MOTORS

BACKGROUND

This invention relates to method and apparatus for testing a DC motor and particularly relates to the testing of a permanent magnet DC motor. The following references were found in a search of the prior art: U.S. Pat. Nos. 2,890,410 to Holcomb; 3,061,777 to Bendell; 3,177,347 to Cowley; 3,651,402 to Leffmann; 3,758,857 to Simpson et al; and the publication "Measurement of Motor Time Constant," *IBM Technical Disclosure Bulletin*, Volume 14, No. 6, Nov., 1971 by W. L. Lohmeier.

Although the method and apparatus of the invention is believed to be generally suitable for testing other DC motors types, it is particularly suitable for the testing of DC motors of the permanent magnet type. Permanent magnet DC motors conventionally are tested with a dynamometer.

In the high volume production testing of permanent magnet DC motors with a dynamometer, a fixture is required to hold the motor securely in place and to maintain it in precise alignment with a torque coupler. The torque coupler connects the motor output shaft to a torque brake. The torque brake is used to apply a specified torque to the motor output shaft. Means must be provided for applying voltage to the motor terminals and for measuring such voltage. An electronic counter is required to measure and indicate the motor rpm. An ammeter also is required to indicate the current flowing in the motor under test. Typically, these components are located in a cabinet structure and each motor to be tested is placed in its best fixture and connected to the torque coupler. The motor terminals are electrically connected to the cabinet power supply, which applies a specific voltage across the motor terminals. A specific torque is applied to the output shaft of the motor in the direction opposite to normal motor rotation. The maximum current flow through the motor is recorded, as is the rpm of the output shaft. If the amperage and rpm are within specification limits established for the motor under test, the motor is considered acceptable and the test is complete. A complete dyamometer test cycle on a high volume production basis requires from 10 to 12 seconds for completion.

SUMMARY OF THE INVENTION

In accordance with the invention, apparatus for testing a DC motor includes a constant voltage source which is applied across the terminals of the motor to be tested for a first predetermined time interval. During this first predetermined time interval, the apparatus monitors the current flow through the motor to determine if the current falls below a predetermined level. Current flow below this predetermined level during the constant voltage application is indicative of a defect in the motor, such as an open armature winding or open commutator segment. It also may be indicative of high resistance in the brush contacts or armature.

At the end of the first predetermined time interval, the constant voltage is removed from the terminals of the motor and it is permitted to come to rest. A constant current then is caused to flow through the motor for a second predetermined time interval. During this second predetermined time interval, the motor terminal voltage is monitored. If at the end of the second predetermined time interval the motor terminal voltage is below a first level or above a higher second level, that is, if the motor terminal voltage then is outside of a predetermined voltage range, the motor is determined to be defective. The voltage limits of this range preferably are experimentally determined by the testing of a large number of motors, for example, 100 motors or more, to provide a statistically significant sample of motor terminal voltages at the end of a fixed time interval during which constant current flows through the motors being tested. The motors of this sample group also may be tested on a dynamometer to establish which of the motors are empirically good and which are defective. From the resulting data, a distribution curve of motor terminal voltages that occur at the end of the fixed time interval is obtained and desirable upper and lower limits for the motor terminal voltage may be selected to establish the voltage range to be used in constant current testing of motors of the type represented by the sample group.

As previously stated, the constant voltage portion of the test performed by the apparatus of the invention is particularly useful in detecting motors having open or high resistance circuits. During the constant current portion of the test, such motors will have uneven terminal voltages.

The constant current portion of the test is particularly useful in detecting motors having shorted armature windings or the like. This produces a low uneven voltage at the end of the aforementioned second predetermined time interval. A motor having a low permanent magnet charge also will have a low terminal voltage at the end of the second predetermined time interval during the constant current test portion. A motor having a high permanent magnet charge has a high terminal voltage at the end of the second predetermined interval during the constant current portion of the test. The test apparatus also will detect motor defects such as tight end bearings.

The invention may be better understood by reference to the detailed description which follows and to the drawings.

BRIEF DESCRIPTION OF THE DRAWINGS

FIG. 1 is an electrical block diagram of apparatus for testing a permanent magnet DC motor;

FIG. 2 is a schematic electrical diagram of constant voltage and constant current power supplies, a permanent magnet DC motor under test, a current sensor, and a portion of a constant voltage-constant current switch shown in block form in FIG. 1;

FIG. 3 is a schematic electrical diagram of a timing circuit and the remaining portion of the constant voltage-constant current switch shown in block form in FIG. 1;

FIG. 3A provides schematic detail of circuitry in FIG. 3;

FIG. 4 is a schematic electrical diagram of a constant voltage comparator circuit shown in block form in FIG. 1;

FIG. 5 is a schematic electrical diagram of a constant current comparator circuit shown in block form in FIG. 1; and FIG. 6 is a schematic electrical diagram of an accept/reject display circuit shown in block form in FIG. 1.

DETAILED DESCRIPTION

With reference now to the drawings, wherein like numerals refer to like parts in the several views, there is shown in FIG. 1 a schematic electrical block diagram of circuitry, generally designated by the numeral 10, suitable for use in testing a permanent magnet DC motor. The circuit 10 includes a constant voltage power supply 12 and a constant current power supply 14. The constant voltage power supply provides a constant voltage, through a current sensor 16 and a constant voltage-constant current switch 18, to the terminals of a permanent magnet DC motor 20 under test. The constant current power supply 14 is coupled through the constant voltage-constant current switch 18 to the motor 20 under test and causes a constant current to flow through the motor 20 when connected thereto by the constant voltage-constant current switch 18.

The current sensor 16 provides a signal to a constant voltage comparator circuit 24. The output of the constant voltage comparator is supplied to an accept/reject display 26. A constant current comparator circuit 28 is coupled to the terminals of the motor 20 under test to provide this circuit with a voltage signal equal or proportional to the voltage across the terminals of the motor. The output of the constant current comparator circuit 28 is supplied to the accept/reject display 26. A timing circuit 22 controls the operation of the constant current power supply 14, the constant voltage-constant current switch 18, the constant voltage comparator circuit 24, the constant current comparator circuit 28 and the accept/reject display circuit 26.

In the method of operation of the test apparatus 10, a constant voltage from the power supply 12 is supplied through the constant voltage-constant current switch 18 to the terminals of a permanent magnet DC motor 20 under test. This constant voltage is applied to the motor for a first predetermined time interval, and the current sensor 16 senses the amount of current flowing through the motor during this first time interval. The constant voltage comparator circuit 24 during this first predetermined time interval compares a voltage signal, proportional to the current flow through the motor, with a predetermined voltage reference level. If at any time during the first predetermined time interval the current flow through the motor falls below that represented by the predetermined voltage reference level, then a memory device within the comparator circuit 24 is set to store an electrical signal indicative of the fact that this has occurred. At the end of the first predetermined time interval, the constant voltage-constant current switch is caused by the timing circuit 22 to disconnect the constant voltage power supply from the motor. The motor, which will have been rotating, is allowed to come to a rest.

The timing circuit 22 then causes the constant voltage-constant current switch 18 to connect the constant current power supply 14 to the motor 20 under test to cause a constant current to flow through it. Once the voltage across the terminals of the motor has reached a threshold, a second predetermined time interval is begun during which the constant current comparator circuit 28 monitors the voltage across the terminals of the motor 20. If at the end of this second predetermined time interval the motor terminal voltage is outside of a predetermined voltage range, that is, if the voltage across the terminals of the motor is below a first level or above a higher second level, then the constant current comparator circuit 28 causes a memory device within it to retain an electrical signal indicative of the fact that the terminal voltage at the end of the second predetermined time interval was outside this range. The timing circuit 22 then causes the accept/reject display circuit 26, which is coupled to the memory devices in the comparator circuits 24 and 28 to indicate whether or not the motor under test is acceptable or should be rejected. This completes the test cycle and another permanent magnet DC motor may then be tested. The total time required to test a fractional horsepower permanent magnet DC motor typically is less than 900 milliseconds (ms), which is in marked contrast to the 10 to 12 seconds required for dynamometer testing of such motors. Moreover, the test method of the invention does not require that the shaft of the motor be connected through a torque coupler to a torque brake, but rather the motor shaft is freely rotatable.

FIGS. 2 through 6 are detailed schematic electrical diagrams of the test apparatus shown in block form in FIG. 1. In these figures, various portions of the electrical circuits are indicated by broken lines and the areas within broken line portions are indicated by numerals corresponding to those designating the blocks in FIG. 1.

With particular reference to FIG. 2, it may be seen that the constant voltage power supply 12 includes a Hewlett-Packard Model 6268B DC power supply 30 having the terminal connections indicated. AC line voltage is supplied to the power supply 30 via input terminals L1 and L2. Terminals A5, A6 and A7 of the power supply 30 are connected together, as are its terminals A2 and A3.

Terminals B+ and B− of the constant voltage power supply are connected, respectively, to leads 32 and 34. The lead 32 is connected through relay contacts CR3-1 and by a lead 36 to a terminal 38 of the motor 20. During operation of the motor, the terminal 38 is positive relative to its opposite terminal 40. The terminal 40 is connected to ground at 42 and is connected by leads 44 and 46 to a current shunt 48. The current shunt 48 comprises the current sensor 16, the voltage across it is directly proportional to the current flowing through the motor 20 when the constant voltage is applied across motor terminals 38 and 40. The lead 34 connects the negative terminal of the current shunt 48 to the B− terminal of the constant voltage power supply 30. Preferably, at 50 amperes of current flow, the current shunt produces 100 millivolts across its terminals. Signal lead wires 54 and 56 are connected, respectively, to the negative and positive terminals of the current shunt 48 to convey the millivoltage signal across the current shunt to the constant voltage comparator circuit 24.

A lead wire 50 connects the negative terminal 40 of the motor 20 to the S− terminal of the power supply 30 and a lead 52 connects the positive terminal 38 of the motor, when the relay contacts CR3-1 are closed, to the S+ terminal of the power supply 30. The power supply 30 maintains a constant voltage across its terminals S+ and S−. This constant voltage may be adjusted by a variable resistor 51 connected between the power supply A3 and S− terminals.

The constant current power supply 14 includes a Hewlett-Packard model 6268B DC power supply 58 connected as a constant current power supply, that is, its terminals A6 and A7 are interconnected, as are its terminals S+ and B+, its terminals B− and S−, and its terminals A1, A2 and A3. A lead 60 is connected to the B+ terminal of the constant current power supply 58. The lead 60 is connected by a lead 62, by normally closed relay contacts CR5−1 and by a lead 64 to the B− terminal of the power supply 58. A lead 66 connects the lead 64 to the lead 44 connected to the negative terminal 40 of the motor 20, and the power supply lead 60 is connected by lead 68, by normally closed relay contacts CR4-1 and by a lead 70 to the lead 36 connected to the positive terminal 38 of the motor 20. A signal lead 72 is connected through lead 44 to the negative terminal 40 of the motor, and a signal lead 74 is connected to the positive terminal 38 of the motor. Thus, the voltage across the terminals 38 and 40 of the motor 20 appears across the signal leads 72 and 74, which leads are connected to the constant current comparator circuit 28.

The relay contacts CR3-1, CR4-1 and CR5-1 form a portion of the constant voltage-constant current switch 18, and, hence, are enclosed by broken lines 18a to so indicate. The remaining portion of the constant voltage-constant current switch 18 is shown in FIG. 3 and is indicated by the numeral 18b.

The constant current power supply circuit 14 includes a lead 76, connected to the terminal A7 of the power supply 58, normally closed relay contacts tD1-3, and a lead 78 connected to the terminal A4 of the power supply 58. A variable resistor 79 is connected between the leads 76 and 78 to provide adjustments of the constant current produced by the power supply 58. Terminals L1 and L2 of the power supply 58 are connected to AC line voltage to provide its operating power.

The timing circuit 22 and the portion 18b of the constant voltage-constant current switch are shown in FIG. 3. These circuits are supplied with +24 volts DC connected across voltage supply leads 80 and 82. Supply lead 80 is positive with respect to lead 82, which is connected to ground potential. A control relay CR1 is connected in series with a manually operated switch 84, this series circuit being connected across the voltage supply leads 80 and 82. A field dissipation diode 86 is connected in parallel with the control relay CR1. Control relay CR1 controls the operation of relay contacts CR1-1, CR1-2 and CR1-3.

Relay contact CR1-1 connect the positive voltage supply lead 80 with a voltage supply lead 88. A first time delay circuit 91 is connected by a lead 106 to the supply lead 88 and by a lead 108 to the supply lead 82. Initiation of the first time delay circuit 91 is controlled by the opening of the normally closed relay contacts CR1-2 connected between this time delay circuit and the ground lead 82. The timing circuit 22 also includes a second time delay circuit 92, a third time delay circuit 93, a fourth time delay circuit 94, a fifth time delay circuit 95 and a sixth time delay circuit 96. The second time delay circuit 92 is initiated by the opening of normally closed relay contacts tD-1, the third time delay circuit 93 is initiated by the opening of normally closed relay contacts tD2-1, the fourth time delay circuit is initiated by the opening of normally closed relay contacts CR2-1, the fifth time delay circuit is initiated by opening of normally closed relay contacts tD4-1 and the sixth time delay circuit is initiated by the opening of normally closed relay contacts tD5-1.

All of the time delay circuits 91, 92, 93, 94, 95 and 96 are identical. FIG. 3A shows the schematic electrical detail for the first time delay circuit 91. The time delay circuit 91 receives its positive voltage supply via supply lead 88 and lead 106. A resistor 101 is connected at one of its terminals to the lead 106 and at its other terminal to the cathode of a zener diode 103. The anode of the zener diode 103 is connected through the lead 108 to the ground voltage supply lead 82. Thus, a regulated voltage appears at the lead 105 connected to the junction between the resistor 101 and the zener diode 103. The movable arm 107 of a variable resistor 109 is connected to the lead 105, and the variable resistor 109 is serially connected through a resistor 111 and a timing capacitor 113 to the lead 108. The junction 115 formed between the resistor 111 and the capacitor 113 is connected through a resistor 117 to the external normally closed relay contacts CR1-2. Also, the junction 115 is connected to the emitter of a unijunction transistor 119. The base one electrode 121 of this transistor is connected through a resistor 123 to the ground lead 108. The base two electrode 125 of the transistor 119 is connected through a resistor 127 to the lead 105. The gate electrode 129 of an SCR 131 is connected to the base one electrode 121 of the unijunction transistor 119. The cathode of the SCR 131 is connected to the lead 108 and its anode is connected through a relay coil tD1 to the lead 106. A field dissipation diode 133 is connected in parallel with relay coil tD1.

In the operation of the time delay circuit of FIG. 3A, the normally closed relay contacts CR1-2 shunt the timing capacitor 113 causing the capacitor to be discharged. When the relay contacts CR1-2 open, the regulated supply voltage on lead 105 charges the capacitor 113 through the resistors 109 and 111. The rate at which the capacitor 113 is charged is controlled by the magnitude of the resistance 109, which is adjustable. As the capacitor 113 charges, the voltage at the junction 115 increases to the point where the emitter-base one junction of the unijunction transistor 119 is forward biased. This produces a positive voltage signal on the gate electrode 129 of the SCR 131 to render it conductive between its anode and cathode. This energizes the relay coil tD1.

The relay coil tD1 controls relay contacts tD1-1 and tD1-2 and tD1-3. Similarly, the second time delay circuit 92 has a relay coil tD2 which controls relay contacts tD2-1, tD2-2 and tD2-3. The third time delay circuit 93 has a relay coil tD3 which controls relay contacts tD3-1 and tD3-2. The fourth time delay circuit 94 has a relay coil tD4 which controls relay contacts tD4-1 and tD4-2. The fifth time delay circuit 95 has a relay coil tD5 which controls relay contacts tD5-1, tD5-2 and tD5-3. The sixth time delay circuit 96 has a relay which controls relay contacts tD6-1.

The time delay circuits 91 through 96 are each designed to provide a predetermined time delay between their initiation and energization of their respective relays. These predetermined time periods, as specifically indicated in FIG. 3, are intended for use in the testing of a fractional horse-power permanent magnet motor similar to the type which is utilized as a motor vehicle heater or air conditioner blower motor. Of course, different delay times may be chosen for the testing of other DC motors, or even DC motors of the same type but of different specifications.

In FIG. 2, the constant voltage-constant current switch portion 18b includes parallel-connected relay coils CR3 and CR4 and field dissipation diodes 100 and 102. This parallel circuit arrangement is connected in series with normally closed relay contacts *t*D2-2 and normally open relay contacts CR1-3. Also, a relay coil CR5, connected in parallel with a field dissipation diode 104, is connected in series with normally open relay contacts *t*D3-1 and normally closed relay contacts *t*D6-1.

In the operation of the test circuitry 10, the motor 20 under test is energized and the test initiated upon closure of the manually operated switch 84. Closure of the switch 84 energizes the control relay CR1 and causes normally open contacts CR1-1 to close supplying DC voltage to the supply lead 88 and the various time delay circuits 91 through 96. Relay contacts CR1-2 are opened and the first time delay of 150 ms thereby is initiated. Relay contacts CR1-3 close to energize control relay CR3. Energization of control relay CR3 results in the closure of normally open contacts CR3-1 (FIG. 2) and a constant voltage from the power supply 12 is applied across the terminals 38 and 40 of the motor under test. The constant current power supply 14 is isolated from the motor 20 because control relay CR4 is energized concurrently with control relay CR3, and normally closed relay contacts CR4-1 in the constant voltage-constant current switch circuit 18a are opened.

After the 150 ms time delay of the first time delay circuit 91, its relay *t*D1 is energized causing the normally closed contacts *t*D1-1 to open. This initiates the interval of the second time delay circuit 92. Also, normally closed relay contacts *t*D1-2 (FIG. 4) and *t*D1-3 (FIG. 2) are opened. The opening of relay contacts *t*D1-3 allows the constant current power supply 58 to flow a constant current through normally closed control relay contacts CR5-1. This is necessary to allow the current to build to its constant value prior to being applied to the motor.

The opening of the relay contacts *t*D1-2 allows the input 162 to a NAND-gate 160 (FIG. 4) to be brought to a high (positive) logic voltage level as a result of the connection of this input through a pull-up resistor 154 to a +12 volts DC supply lead 158. The other input 164 to this NAND-gate 160 already is at a high logic level because relay contacts *t*D2-3 are open and this input 164 is connected through a pull-up resistor 156 to the supply lead 158. As a result, the output 166 of the NAND-gate 160 is at a low logic voltage level. The output 166 is inverted by an inverter 168 and the resulting high logic level appearing on the lead 170 is applied to one input of a NAND-gate 172. Thus, for the 50 ms time delay of the second time delay circuit 92, the input lead 170 to the NAND-gate 172 is at a high logic level. The other input 174 to the NAND-gate 172 is obtained from the collector of a transistor 144.

The transistor 144 is part of an amplifier circuit which includes linear operational amplifiers 110, 112 and 114. Negative lead 54 from the current shunt 48 is connected through an input resistor 122 to the negative input of operational amplifier 110. The positive lead 56 from the current shunt 48 is at ground potential. The positive inputs to the amplifiers 110, 112 and 114 are connected by a lead 120 to ground potential. A feedback resistor 124 connects the output of the amplifier 110 to its negative input, and the value of this feedback resistor and the input resistor 122 are chosen in the embodiment disclosed to provide a gain of 100 for the amplifier 110. Lead 116, connected to +15 volts DC, and lead 118, connected to −15 volts DC, provide the necessary supply voltage for the operational amplifiers.

The output of the amplifier 110 is connected through an input resistor 126 to the negative input to the amplifier 112. A feedback resistor 128 is connected between the output of the amplifier 112 and its negative input. The resistors 126 and 128 are of equal value and provide unity gain for the amplifier 112. The output of the amplifier 112 is connected through an input resistor 130 to the negative input to the amplifier 114. The negative input to this amplifier also is connected through an input resistor 132 to the arm 134 of a potentiometer 136. One terminal of the potentiometer 136 is connected to ground and its other terminal is connected through a resistor 138 to a lead 140 connected to +15 volts DC. The lead 140 also is connected through a resistor 142 to the collector of the transistor 144. The emitter of the transistor 144 is connected to ground and its base is connected through a current limiting resistor 146 and a blocking diode 148 to the output of the amplifier 114. An indicating light 152 is connected to the collector of the transistor 144 and is connected through a resistor 150 to the +12 volt DC supply lead 158.

During the portion of the test that constant voltage from the power supply 12 is applied to the motor 20 under test, the current shunt 48 monitors the current drawn by the motor. The current shunt 48 is a 50 ampere–100 mv sensor that produces a voltage linearly related to the amount of current flowing through it, for example, a current of 5 amperes drawn by the motor would produce a 10 mv voltage drop across the lead wires 56 and 54 which form the input to the operational amplifier 110. The operational amplifier 110 amplifies and inverts this voltage signal. Thus, for example, with the signal lead 54 at −10 mv with respect to the positive signal lead 56, the output of the operational amplifier 110 would be +1 volt with respect to the grounded positive lead 56, the amplifier 110 providing a voltage gain of 100. The unity gain amplifier 112 inverts the signal on the output lead of the amplifier 110 such that, in the preceding example, the output of the amplifier 112 would be −1 volt with respect to the signal lead 56.

The output signal from the amplifier 112 is applied through the input resistor 130 to the negative input to the amplifier 114. The arm 134 of the potentiometer 136 has a reference potential on it which is positive with respect to ground and which is applied to the negative input of the amplifier 114 through the resistor 132. If the output of the operational amplifier 112 is below ground potential by an amount greater than the amount the arm 134 of the potentiometer is above ground potential, then the negative input to the amplifier 114 is negative relative to its positive input and the amplifier 114 produces a positive voltage at its output which attains a magnitude near that of the +15 volt DC supply potential to the amplifier. This positive voltage signal at the output of the amplifier 114 forward biases the diode 148 and supplies base-emitter current to the transistor 144 which then is rendered conductive in its collector-emitter output circuit. This produces substantially ground potential on the lead 174 connected to the junction formed between the collector of the transistor 144 and the resistor 142. The indicating light 152 is energized as a result and a low voltage signal is applied to the lead 174 input to the NAND-gate 172.

If the output signal from the operational amplifier 112, which signal is negative and proportional in magnitude to the magnitude of the current drawn by the motor 20, is smaller in magnitude than the reference voltage level on the arm 134 of the potentiometer 136, then the output of the amplifier 114 is negative and the diode 148 is reverse-biased and the transistor 144 is nonconductive in its collector-emitter output circuit. In such case, the indicating lamp 152 is extinguished and the lead 174 input to the NAND-gate 172 is at a high logic level. Thus, a high logic level signal on the lead 174 is indicative of a current, drawn by the motor 20 and sensed by the current shunt 48, which is less than a reference or predetermined level established by the setting of potentiometer arm 134.

The current I versus time waveform shown in the upper left hand corner of FIG. 4 shows the current drawn by a good motor during the constant voltage portion of the test. After the current has built up and relay contact *t*D1-2 has opened, the input 170 to the NAND-gate 172 is at a high logic voltage level for 50 ms corresponding to the time delay of the second time delay circuit 92. If during this 50 ms the logic voltage level on the lead 174 input to the NAND-gate 172 becomes high to indicate a current drawn by the motor less than the predetermined reference level established by the potentiometer 136, then the output 176 of the NAND-gate 172 achieves a low logic voltage level which is inverted by the inverter 178 to a high logic voltage level. A high logic voltage level signal at the output of the inverter 178 produces a positive pulse at the gate 182 of the SCR 184 memory device. Pulse forming capacitors 180 and 186 become charged, but thereafter are discharged when the output of the inverter 178 once again becomes a low logic level signal. The diode 188 provides a discharge path for the capacitor 180.

The positive pulse on the gate lead 182 of the SCR 184 renders it conductive between its anode and cathode. This causes the lead 192 to reach substantially ground potential due to current flow from the supply lead 158 through the normally open contacts CR1-4, which will have been closed upon energization of relay coil CR1, through the resistor 190 and through the SCR 184 to the ground lead 56. The memory device or SCR 184 thus becomes conductive and a low voltage signal appears on the lead 192 if the current drawn by the motor 20 under test falls below the predetermined reference level during the 50 ms interval of the second time delay. The SCR 184 remains conductive until the end of the test cycle. If the current drawn by the motor does not fall below the predetermined level, then the SCR 184 is not energized. At the end of the second time delay, the relay contacts *t*D2-3 are closed to place a low logic level signal on the input lead 164 to the NAND-gate 160. This results in a low logic level signal on the lead 170 to the NAND-gate 172 and thereafter prevents a low logic level from occurring on the output lead 176 of the NAND-gate 172. This prevents gating of the SCR 184 once the relay contact *t*D2-3 has closed.

The energization of the relay *t*D2 not only signals the end of the 50 ms constant voltage portion of the test cycle, but also opens normally closed relay contacts *t*D2-1 to initiate the third time delay. At this time, normally closed relay contacts *t*D2-2 are opened and relay coils CR3 and CR4 are de-energized. This causes relay contacts CR3-1 (FIG. 2) to open disconnecting the motor 20 under test from the constant voltage power supply 12. The relay contacts CR4-1 revert to their normally closed condition. The opening of contacts CR3-1 removes the voltage supply to the motor 20 and allows its armature to come to rest before the constant current portion of the test is initiated. Closed relay contacts CR4-1 set up the current path to the motor 20 for the constant current test. Current is enabled to flow from the constant current power supply 14 to the motor 20 when normally closed relay contacts CR5-1 are opened. This current to the motor flows through leads 60 and 68, closed contacts CR4-1, lead 36 and leads 44, 66 and 64. Once the relay contacts CR5-1 open to permit constant current to flow into the motor, the time required for the motor current to build to its constant value is minimal and considered constant for any given family of motors.

At the end of the 500 ms third interval, which is the power supply transfer time interval, the third time delay circuit 93 has its relay coil *t*D3 energized. Its normally open relay contacts *t*D3-1 close permitting current to flow through relay coil CR5 (FIG. 3). Normally closed relay contacts CR5-1 (FIG. 2) open to cause the constant current from the constant current power supply 14 to flow through the motor 20 under test. The motor armature begins to rotate under a constant current mode of operation and the motor terminal voltage begins to increase from zero. The terminal voltage appears across signal leads 74 and 72 and forms the input to the constant current comparator circuit 28 shown in FIG. 5. The motor terminal between signal leads 74 and 72 is divided by parallel resistors 200, 202 and 204 connected in series with resistor 208. The junction 206 formed between the combination of parallel resistors and the resistor 208 is connected through an input resistor 210 to the negative input to an operational amplifier 212. The positive input to this amplifier is connected to ground potential, which is the potential of the signal lead 72. The amplifier 212 is connected by a lead 220 to a supply voltage of −15 volts DC and by a lead 222 to a supply voltage of +15 volts DC.

A resistor 214 is connected at one of its terminals to the negative input to the amplifier 212 and at its other terminal to the arm of a potentiometer 216. One terminal of potentiometer 216 is connected to ground potential and its other terminal is connected through a resistor 218 to the −15 volts DC supply voltage. The output of the amplifier 212 is connected through a blocking diode 224 and a current limiting resistor 226 to the base of a transistor 228. The emitter of the transistor 228 is connected to ground and its collector is connected through a pull-up resistor 230 to a supply voltage of +5 volts DC. A lead 232 connects the junction formed between the resistor 230 and the collector of the transistor 228 to the supply voltage terminal of an inverter 234.

A resistor 235 has one of its terminals connected to +5 volts DC and has its other terminal connected through normally closed relay contacts *t*D3-2 to ground. The junction formed between the resistor 235 and these relay contacts is the input to the inverter 234. The output of the inverter 234 is connected through a control relay CR2 to +24 volts DC. A field dissipation diode 238 is connected in parallel with the relay coil CR2.

The function of the circuitry just described is to detect a low threshold voltage across the motor terminals, which insures that constant current is flowing through the motor, prior to initiation of a precisely timed interval. Thus, the potentiometer 216 through its arm and the resistor 214 applies a reference negative voltage level to the negative input to the amplifier 212. A positive voltage signal proportional to the motor terminal voltage appears at the junction 206. and is applied through the input resistor 210 to the negative input to the amplifier 212. When the positive voltage at the junction 206 exceeds the negative voltage setting on the arm of the potentiometer 216, then the negative input to the amplifier 212 becomes more positive than its grounded positive input and the amplifier output immediately goes to its full negative level. This reverse-biases the blocking diode 224, which protects the transistor 228, and changes the previously conductive collector-emitter output circuit of the transistor 228 to a non-conductive condition. When this occurs, the inverter 234 is enabled because it then receives a +5 volt DC supply potential at its supply terminal through the pull-up resistor 230. The relay contacts tD3-2 are opened when the relay coil tD3 in the third time delay circuit 93 is energized. This will have occurred prior to the transistor 228 being rendered nonconductive to provide the supply voltage for the inverter 234. When the contacts tD3-2 open, a high logic voltage signal is applied to the input of the inverter 234, and with the supply voltage on the lead 232, the inverter output becomes a low logic voltage level signal. In this condition, the internal output circuit of the inverter 234 provides a conduction path for current flow through the relay coil CR2 from the +24 volt DC supply to which it is connected. Thus, relay coil CR2 is energized when the motor terminal voltage reaches a predetermined threshold level.

The energization of relay coil CR2 causes its normally closed contacts CR2-1 (FIG. 3) to open initiating the fourth time delay circuit 94. This time delay circuit provides a 250 ms time interval during which constant current flows through the motor 20 under test.

The function of the circuitry in FIG. 5 not yet described in detail is to determine whether or not the terminal voltage of the motor 20 under test is outside of a selected voltage range at the end of the predetermined 250 ms time interval. Thus, if the motor terminal voltage at the end of this time interval is below a predetermined first level or above a predetermined higher second level, then the motor under test is found to be defective.

The low limit of the selected voltage range is determined by an operational amplifier 240 and its associated circuitry. The amplifier 240 has its positive input connected by leads 242, 244 and 246 to the ground signal lead 72 from the negative terminal of the motor 20 under test. A voltage signal proportional to the motor terminal voltage is obtained via a lead 248 connected to the junction 206. The lead 248 is connected through an input resistor 250 to the negative input to the amplifier 240. A resistor 252 also is connected to this negative input and to the arm 254 of a potentiometer 256. One terminal of the potentiometer 256 is connected to ground and its other terminal is connected through a resistor 258 to −15 volts DC. Thus, the arm 254 of the potentiometer has a preset negative voltage on it which is applied through input resistor 252 to the negative input of the amplifier 240. The amplifier 240 is connected by a lead 260 to +15 volts DC and by lead 262 to −15 volts DC. The output of amplifier 240 is connected through a blocking diode 264 and a current limiting resistor 266 to the base of a transistor 268 whose emitter is connected by a lead 270 to the grounded lead 244. The collector of the transistor 268 is connected through a resistor 272 to +15 volts DC.

If the motor terminal voltage is above ground potential by an amount greater than the amount the arm 254 of the potentiometer 256 is below ground potential, then the negative input to the amplifier 240 is more positive than its positive input and the amplifier output 240 is negative. This maintains the blocking diode 264 reversebiased and prevents conduction of the transistor 268. However, should the motor terminal voltage fall to a level where the lead 248 exceeds ground potential by an amount less than the amount of the arm 254 of the potentiometer 256 is below ground potential, then the negative input to the amplifier 240 is negative with respect to its positive input and the amplifier output becomes positive. This forward-biases the base-emitter junction of the transistor 268 to render it fully conductive in its collector-emitter output circuit. Thus, conduction of the transistor 268 indicates that the motor terminal voltage is below a predetermined reference level determined by the position of the arm 254 of the potentiometer 256. The conductive state of the transistor 268 is of interest as of the end of the 250 ms fourth time delay interval. An indicating lamp 274, connected through a resistor 276 to +12 volts DC, is illuminated whenever the transistor 268 output circuit is conductive.

A lead 278 is connected to the junction formed between the collector of the transistor 268 and the resistor 272. The lead 278 is at a high or one logic voltage level when the transistor 268 is nonconductive and is at a low or zero logic voltage level when the transistor 268 is conductive. The lead 278 forms an input to a NAND-gate 280. The output 282 of the NAND-gate forms the input to an inverter 284 whose output 286 is coupled through a capacitor 288 to the gate electrode 290 of an SCR 292 used as a memory device. The cathode of the SCR 292 is connected to the ground level 246. A capacitor 294 is connected between the gate electrode 290 and the lead 246 and a diode 296 has its anode connected to the ground lead 246 and has its cathode connected to the junction formed between the capacitors 288 and 294. The anode of the SCR 292 is connected through a resistor 298 to the lead 194 (see FIG. 4).

A motor terminal voltage which is above the high limit of the voltage range is detected by an operational amplifier 300 and its associated circuitry. The amplifier 300 has its positive input lead 302 connected to a ground lead 326. A voltage signal proportional to the terminal voltage of the motor 20 under test is obtained via lead 304 connected to the lead 248. The lead 304 supplies this signal through an input resistor 306 connected to the negative input to the amplifier 300. The negative input to the amplifier 300 also is connected through an input resistor 308 to the arm 310 of a potentiometer 312. One terminal of the potentiometer 312 is connected to ground and its other terminal is connected through a resistor 314 to a supply voltage −15 volts DC. The supply voltages for the amplifier 300 are obtained via a lead 316 connected to +15 volts DC and a lead 318 connected to −15 volts DC. The output of the amplifier 300 is connected through a blocking diode 320 and a current limiting resistor 322 to the base of a transistor 324. The emitter of the transistor 324 is connected to ground lead 326 and its collector is connected through a resistor 328 and an indicating lamp 330 to +12 volts DC.

If the voltage signal on the lead 304 is above ground potential by an amount less than the amount by which the arm 310 of the potentiometer 312 is below ground potential, then the amplifier 300 negative input is more negative than its positive input and the amplifier output voltage is positive, which forward-biases the blocking diode 320 and maintains the collector-emitter output circuit of the transistor 324 conductive. However, should the voltage signal on the lead 304 exceed ground potential by an amount greater than the amount by which the arm 310 is below ground potential, then the output of the amplifier 300 is negative, the diode 320 is reverse-biased and the transistor 324 is nonconductive in its collector-emitter output circuit. Nonconduction of the output circuit of the transistor 324 is indicative of a motor terminal voltage outside of and above the high limit of the predetermined voltage range. The indicating lamp 330 is illuminated when the transistor 324 is conductive. This lamp 330 and the lamp 274 in the low limit detection circuit are used for circuit setup purposes.

A lead 332 forms the input to an inverter 334 and is connected to the junction formed between the collector of the transistor 324 and the resistor 328. The output 336 of the inverter 334 forms one input to a NAND-gate 338. The output 340 of the NAND-gate 338 is the input to an inverter 342 whose output 344 is connected to the output lead 286 of the inverter 284.

The NAND-gate 338 has another input 346 which is connected to a lead 348. The lead 348 also is connected as an input to the NAND-gate 280 and is the output of an inverter 350. The input 352 to the inverter 350 is the output of a NAND-gate 354. An input 356 to the NAND-gate 354 is connected to the junction formed between a resistor 358 and normally open relay contacts tD5-2. The resistor 358 is connected at its upper terminal to +12 volts DC and the relay contacts tD5-2 are connected to ground. The second input 360 to the NAND-gate 354 is connected to the junction formed between a resistor 362 and normally closed relay contacts tD4-2.

At the end of the 250 ms predetermined time interval during which constant current has been applied to the motor 20 under test, relay tD4 in the fourth time delay circuit is energized and its normally closed contacts tD4-1 (FIG. 3) and tD4-2 (FIG. 5) are opened. When the relay contacts tD4-1 open, a 10 ms fifth time delay is initiated. The opening of the normally closed relay contacts tD4-2 causes a high or one level logic signal to be applied to the input 360 to the NAND-gate 354. At this time, the input 356 is at a high or one logic voltage level and, therefore, the output 352 of the NAND-gate 354 becomes a low or zero logic level signal. The inverter 350 inverts this zero level logic signal to produce a one logic level signal on the lead 348. This one level signal on the lead 348 forms one of the inputs to the NAND-gate 280, and via lead 346, forms one of the inputs to the NAND-gate 338. While this one level signal 348 is on the lead 348, a one level signal on the input 278 to the NAND-gate 280 will produce a zero level signal on its output 282. Similarly, a zero level signal on the input 332 to the inverter 334 will produce a one level signal on the input 336 to the NAND-gate 338 and a resulting zero level signal on the output 340 of the NAND-gate 338. A zero level logic signal at the output 282 of the NAND-gate 280 is inverted by the inverter 284 and produces a one level logic signal on its output lead 286 to gate the SCR 292 through the pulse forming capacitors 288 and 294. Similarly, a zero level logic signal on the output lead 340 of the NAND-gate 338 is inverted by the inverter 342 and will gate the SCR 292.

The SCR 292 is gate only if the terminal voltage of the motor 20 under test at the end of the 250 ms predetermined time interval is within the voltage range established by the low and high limit detection circuits previously described. If the motor terminal voltage is outside of this range at the end of the 250 ms time interval, then a zero logic level signal appears on the lead 278 and the output 282 of the NAND-gate 280 remains a one logic level signal when the one level occurs on the lead 348 input to the NAND-gate 280. Thus, the SCR 292 is not triggered conductive. If on the other hand, the motor terminal voltage is higher than the upper limit, then a logic one level signal appears on the input 332 to the inverter 334 and its output is a zero level signal. This maintains the output 340 of the NAND-gate 338 at a one logic level and again the SCR 292 is not triggered to its conductive state. A lead 364 is connected to the anode of the SCR 292. When the SCR 292 is conductive, a zero logic level signal appears on lead 364 indicating that the motor terminal voltage is within the predetermined voltage range. A one logic level signal on lead 364 indicates that the motor is defective and has a terminal voltage outside the predetermined voltage range at the end of the 250 ms constant current time interval.

At the end of the 10 ms fifth time delay interval during which it is determined if the motor terminal voltage is outside the predetermined voltage range, the relay tD5 in the fifth time delay circuit 95 is energized. Its normally closed contacts tD5-1 are opened to initiate the time interval of the sixth time delay circuit 96. Also, its contacts tD5-2 are closed placing the input 356 to the NAND-gate 354 at a zero logic level. The output of the NAND-gate 354 becomes a one level signal which is inverted by the inverter 350 resulting in the application of a zero logic level signal on the lead 348. This holds the output of the NAND-gates 280 and 338 at a one logic level and prevents the SCR 292 memory device from being triggered into a conductive state if it is not already in such state.

With particular reference now to FIG. 6, there is shown the accept/reject circuit 26. This circuit includes an inverter 400 whose input is the lead 192 connected to the anode of the SCR 184 memory device in the constant voltage comparator circuit 24. As previously described, the voltage signal on the lead 192 is at a low or zero logic level if the motor 20 under test is found to be defective during the constant voltage test portion. If the motor is not found to be defective during the constant voltage portion of the test then the signal on the lead 192 is a one logic level.

Another input to the circuit 26 occurs on its input lead 364 connected to the anode of the SCR 292 memory device in the constant current comparator circuit. As previously described, the lead 364 has a zero logic level signal if the motor 20 under test is found to be acceptable during the constant current test portion. On the other hand, if the motor is found to be defective during the constant current test portion, then a one logic level signal appears on the lead 364.

The output of the inverter 400 in the circuit 26 forms an input 402 to a NAND-gate 404. The output 406 of NAND-gate 404 forms the input to an amplifier 408 whose output 410 is connected through an indicating lamp 412 to a +12 volts DC voltage supply lead 414. The amplifier 408, and the other amplifiers 422, 446 and 434 in the circuit 26, are of the type which provide a transistor output to substantially ground potential when the amplifier input is at a zero logic level.

The output 406 of the NAND-gate 404 forms an input 416 to a NAND-gate 418. The output 420 of the NAND-gate 418 is the input to the amplifier 422 whose output 424 is connected through an indicating lamp 426 to the supply lead 414.

In the constant current portion of the accept/reject display circuit 26, the lead 364 forms an input to a NAND-gate 430 whose output 432 is the input to an amplifier 434. The output 436 of the amplifier 434 is connected through an indicating lamp 438 to the voltage supply lead 414. The output 432 of the NAND-gate 430 forms an input 440 to a NAND-gate 442. The output 444 of the NAND-gate 442 is the input to the amplifier 446 whose output 448 is connected through an indicating lamp 450 to the supply lead 414.

A resistor 452 has one of its terminals connected to +12 volts DC and has its other terminal lead 454 connected through normally closed relay contacts tD5-3 to ground. Connected to the lead 454 are leads 456, 458, 460 and 462 which, respectively, form inputs to the NAND-gates 404, 418, 442 and 430.

When the relay coil tD5 in the fifth time delay circuit 95 is energized as previously described, the normally closed relay contacts tD5-3 open, thereby, to cause a one level logic signal to be applied to the NAND-gate inputs 456, 458, 460 and 462. This sets the accept/reject display circuitry 26 for subsequent indication of the constant voltage and constant test results. If during the constant voltage test portion, the motor 20 under test was found acceptable, the resulting one logic level signal on the lead 192 causes a zero level signal to appear on the input lead 402 to the NAND-gate 404. This causes a one logic level signal to appear on its output 406 and this is applied to the input 416 to the NAND-gate 418. Thus, both inputs 416 and 458 to the NAND-gate 418 are one level signals and a zero logic level signal appears on its output 420. The amplifier 422 then provides a ground path which permits current to flow from the voltage supply lead 414 through the constant voltage "accept" indicating lamp 446, thereby, indicating that the motor has passed the constant voltage test portion. However, if a zero logic level signal appears on the lead 192 to indicate a motor 20 found defective during the constant voltage portion of the test, then a one logic level signal appears on the input lead 402 to the NAND-gate 404 and the output 406 of this NAND-gate is at a zero logic level. This causes the amplifier 408 to provide a ground path which results in illumination of the constant voltage "reject" indicating lamp 412.

As to the constant current portion of the accept/reject display circuitry 26, a zero logic level signal on the lead 364, indicating a motor found acceptable during the contrast current test, produces a one logic level signal on the output 432 of the NAND-gate 430. This one logic level signal is applied to the input 440 to the NAND-gate 442 and causes a zero logic level signal to appear at its output 444. This causes the amplifier 446 to provide a ground path for current flow through the constant current "accept" indicating lamp 450. If a one logic level signal appears on the lead 364, then the output of the NAND-gate 430 is a zero logic level signal which causes the amplifier 434 to provide a ground path resulting in illumination of the constant current "reject" indicating lamp 438.

As was previously stated, the sixth time delay period is initiated by energization of the relay coil tD5 in the fifth time delay circuit 95. The sixth time delay interval is of a length sufficient to permit the appropriate indicating lamps in the accept/reject display circuit 26 to be illuminated and noted by the operator of the test apparatus. At the end of the sixth time delay interval, the relay coil tD6 in the circuit 96 is energized causing normally closed relay contacts tD6-1 in FIG. 3 to be opened. This de-energizes relay CR5 causing its normally closed contacts CR5-1 to close shunting the constant current of the constant current power supply 14 and removing this current from the motor 20 under test. The operator of the test apparatus then opens manually-operated switch 84. This de-energizes control relay CR1 and results in de-energization of the relay coils tD1 through tD6 in the time delay circuits 91 through 96. Also, when control relay CR1 is de-energized, its contacts CR1-4 in FIG. 4 open to reset or commutate the SCRs 184 and 292, thereby, completing the reset of the circuit 10.

In conclusion, it is apparent that the test apparatus 10 causes a constant voltage to be applied across the terminals of the motor 20 under test for a first predetermined time interval. Subsequently, the constant voltage is removed and the motor armature is permitted to cease rotation and come to a rest. Thereafter, a constant current is caused to flow through the motor 20 for a second predetermined time interval. During the constant voltage portion of the test the current through the motor is monitored to determine if the current falls below a predetermined level. During the constant current portion of the test, the motor terminal voltage is monitored to determine if this voltage is within a predetermined voltage range at the end of the second predetermined time interval. A display circuit indicates if the motor 20 is acceptable or should be rejected.

During the constant current portion of the test, the motor terminal voltage increases in a substantially linear manner for a certain period of time. The second predetermined time interval during which constant current flows through the motor 20 preferably is selected to occur during this linear portion of the voltage curve. Preferably, the length of the second predetermined time interval is chosen such that the motor terminal voltage at the end of this interval will not substantially exceed its nominal or rated terminal voltage level. Also, the longer the constant current is applied to the motor, the greater will be the motor's speed. If the motor nominal speed rating is 3,500 rpm, it may, for example, be desirable to limit the length of the second predetermined time interval so that the motor speed at the end of this interval will be less than its rated value or at least less than some maximum value beyond which motor damage is likely to occur.

The rpm of a permanent magnet DC motor is given by the equation:

$$\text{rpm} = 60 \left( \frac{V_T - I_a R_m}{Z \phi} \right) \left( \frac{\text{number of paths}}{\text{number of poles}} \right) \times 10^8$$

where $V_T$ is the motor terminal voltage, $I_a$ is the armature current, $R_m$ is the armature resistance including brush contact resistance, $Z$ is the number of conductors or turns around each pole and $\phi$ is the magnetic air gap flux per pole.

The torque equation for a permanent magnet DC motor is:

$$T = 0.1175 \, Z\phi I_a \left( \frac{\text{number of poles}}{\text{number of paths}} \right) \times 10^{-8} \text{ ft-lbs}$$

During acceleration, the torque $T$ of a permanent magnet DC motor is related to its rpm, to time t and to its moment of inertia $I$ by the equation:

$$T = 0.1047 \, (\text{rpm}/t) \, I \text{ ft-lbs}$$

The moment of inertia $I$ for the armature of a motor is given by the equation:

$$I = \frac{Wr^2}{2g} \text{ lb-ft-sec}^2$$

where $W$ is the armature weight in pounds, $r$ is the armature radius in feet, and $g$ is the acceleration of gravity in feet per second squared.

The first two equations given above may be multiplied together to produce the equation:

$$(\text{rpm}) \, (T) = 7.05(V_T I_a - I_a^2 R_m)$$

The expression $Wr^2/2g$ in the equation for the armature moment of inertia may be substituted for the moment of inertia $I$ in the third equation and the resulting expression for torque $T$ substituted in the preceding equation to produce the equation which follows:

$$\frac{2.306 \times 10^{-4} (\text{rpm})^2 (Wr^2)}{T} = V_T I_a - I_a^2 R_m$$

From the above equation, an approximate second predetermined time interval $t$ may be calculated. This may be accomplished by assuming an rpm value to which it is desired to limit motor speed and by assuming a constant current $I_a$. These assumed values may be used to calculate the motor terminal voltage $V_T$ from the first equation given above. These values for $I_a$, $V_T$ and rpm then may be substituted into the immediately preceding equation, along with the values for $W$ and $r$, and the time $t$ may then be calculated. Preferably, the rpm value substituted in the first equation will be of a magnitude comparable to that normally used in a dynamometer test of a motor of the type involved. The constant current $I_a$ may be chosen to be the nominal current rating of the motor or a comparable value.

Based upon the foregoing description of the invention, what is claimed is:

1. Apparatus for testing a DC motor which comprises:
   a constant voltage source of DC electrical energy;
   a constant current source of DC electrical energy;
   first circuit means for connecting said constant voltage source to said DC motor for a first predetermined time interval;
   second circuit means for sensing the magnitude of current flow through said DC motor when it is connected to said constant voltage source and for generating a first electrical signal if said current magnitude falls below a predetermined level during at least a portion of said first predetermined time interval;
   third circuit means for connecting said constant current source to said DC motor to cause a constant current to flow through said DC motor for a second predetermined time interval; and
   fourth circuit means for sensing the voltage across the terminals of said DC motor during at least a portion of said second predetermined time interval and for generating a second electrical signal if said terminal voltage is outside a predetermined voltage range at the end of said portion of said second predetermined time interval;
   the presence of either said first or second electrical signals being indicative of a defect in said motor.

2. Apparatus according to Claim 1, wherein said first and third circuit means each includes a time interval generating circuit, said time interval generating circuits controlling the length of time said constant voltage and constant current sources are applied to said DC motor, one of said electrical energy sources being connected to said motor and disconnected therefrom before the other of said electrical energy sources is connected thereto.

3. Apparatus according to Claim 2, wherein said test apparatus further includes a third time interval generating circuit for generating a third predetermined time interval, said first and second predetermined time intervals being separated by said third predetermined time interval, said third predetermined time interval being of a length permitting said DC motor to cause rotation after said one of said electrical energy sources in disconnected from said DC motor.

4. A method for testing a DC motor, said method comprising the steps of:
   applying a constant voltage across the terminals of said DC motor for a first predetermined time interval;
   sensing the current flow through said DC motor during at least a portion of said first predetermined time interval;
   with an electrical circuit, generating a first electrical signal if the current flow through said DC motor falls below a predetermined level during said portion of said first time interval;
   causing a constant current to flow through said DC motor for a second predetermined time interval;
   sensing the voltage across the terminals of said DC motor during at least a portion of said second predetermined time interval; and
   with an electrical circuit, generating a second electrical signal if the terminal voltage of said DC motor is outside a predetermined voltage range at the end of said portion of said second predetermined time interval;
   whereby, the occurrence of either of said first or second electrical signals may be used to indicate a defect in said DC motor.

5. A method for testing a DC motor according to Claim 4, wherein said constant voltage is applied across said motor terminals before said constant current is caused to flow through said motor, and wherein said method further comprises the step of causing said motor to cease rotation at the end of said first predetermined time interval and prior to the beginning of said second predetermined time interval.

6. Apparatus for testing a DC motor which comprises:
   a constant voltage source of DC electrical energy;
   a constant current source of DC electrical energy;

first circuit means for connecting said constant voltage source to said DC motor for a first predetermined time interval;

second circuit means for sensing the magnitude of current flow through said DC motor when it is connected to said constant voltage source and for generating a first electrical signal if said current magnitude falls below a predetermined level during at least a portion of said first predetermined time interval, said second circuit means comprising a current shunt for generating a voltage signal proportional to the current flow through said DC motor, and an amplifier circuit having an input coupled to said current shunt, a gate circuit having an input coupled to the output of said amplifier circuit, and a memory device having a controlled electrode coupled to the output of said gate circuit, said first electrical signal being an electrical state of said memory device which state occurs if the magnitude of said current through said shunt falls below said predetermined level during said portion of said first predetermined time interval;

third circuit means for connecting said constant current source to said DC motor to cause a constant current to flow through said DC motor for a second predetermined time interval; and fourth circuit means for sensing the voltage across the terminals of said DC motor during at least a portion of said second predetermined time interval and for generating a second electrical signal if said terminal voltage is outside a predetermined voltage range at the end of said portion of said second predetermined time interval;

the presence of either of said first or second electrical signals being indicative of a defect in said motor.

7. Apparatus according to claim 6, wherein said first and third circuit means each includes a time interval generating circuit, said time interval generating circuits controlling the length of time said constant voltage and constant current sources are applied to said DC motor, one of said electrical energy sources being connected to said motor and disconnected therefrom before the other of said electrical energy sources is connected thereto.

8. Apparatus according to claim 6, wherein said fourth circuit means comprises an amplifier circuit having an input coupled to the terminals of said DC motor and to a reference voltage level, said amplifier producing an output signal which initiates said second predetermined time interval, a low motor-terminal-voltage detection circuit, a high motor-terminal-voltage detection circuit, a gate circuit coupled to said low and high motor-terminal-voltage detection circuits, a memory device, and means for enabling, at the end of said second predetermined time interval, said memory device to attain an electrical state indicative of a defect in said DC motor if at the end of said second predetermined time interval, said low motor-terminal-voltage detection circuit senses a motor-terminal-voltage below a first predetermined level or if said high motor-terminal-voltage detection circuit senses a motor-terminal-voltage above a second predetermined level.

9. Apparatus for testing a DC motor which comprises:

a constant voltage source of DC electrical energy;

a constant current source of DC electrical energy;

first circuit means for connecting said constant voltage source to said DC motor for a first predetermined time interval;

second circuit means for sensing the magnitude of current flow through said DC motor when it is connected to said constant voltage source and for generating a first electrical signal if said current magnitude falls below a predetermined level during at least a portion of said first predetermined time interval;

third circuit means for connecting said constant current source to said DC motor to cause a constant current to flow through said DC motor for a second predetermined time interval; and fourth circuit means for sensing the voltage across the terminals of said DC motor during at least a portion of said second predetermined time interval and for generating a second electrical signal if said terminal voltage is outside a predetermined voltage range at the end of said portion of said second predetermined time interval, said fourth circuit means comprising an amplifier circuit having an input coupled to the terminals of said DC motor and to a reference voltage level, said amplifier producing an output signal which initiates said second predetermined time interval, a low motor-terminal-voltage detection circuit, a high motor-terminal-voltage detection circuit, a gate circuit coupled to said low and high motor-terminal-voltage detection circuits, a memory device, and means for enabling, at the end of said second predetermined time interval, said memory device to obtain an electrical state indicative of a defect in said DC motor if, at the end of said second predetermined time interval, said low motor-terminal-voltage detection circuit senses a motor-terminal-voltage below a first predetermined level, or if said high motor-terminal-voltage detection circuit senses a motor-terminal-voltage above a second predetermined level;

the presence of either said first or second electrical signals being indicative of a defect in said motor.

10. Apparatus according to claim 9, wherein said first and third circuit means each includes a time interval generating circuit, said time interval generating circuits controlling the length of time said constant voltage and constant current sources are applied to said DC motor, one of said electrical energy sources being connected to said motor and disconnected therefrom before the other of said electrical energy sources is connected thereto.

* * * * *

UNITED STATES PATENT AND TRADEMARK OFFICE
CERTIFICATE OF CORRECTION

PATENT NO. : 3,947,764
DATED : March 30, 1976
INVENTOR(S) : Edward H. Abbott et al It is certified that error appears in the above–identified patent and that said Letters Patent are hereby corrected as shown below:

Claim 3, line 29, cancel "cause" and change to

--cease--.

Signed and Sealed this

Fourth Day of November 1980

[SEAL]

*Attest:*

*Attesting Officer*

SIDNEY A. DIAMOND

*Commissioner of Patents and Trademarks*